United States Patent [19]

Takeda

[11] Patent Number: 5,534,922
[45] Date of Patent: Jul. 9, 1996

[54] IMAGE PICKUP DEVICE

[75] Inventor: Nobuhiro Takeda, Kawasaki, Japan

[73] Assignee: Canon Kabushiki Kaisha, Tokyo, Japan

[21] Appl. No.: 376,684

[22] Filed: Jan. 23, 1995

Related U.S. Application Data

[63] Continuation of Ser. No. 942,095, Sep. 8, 1992, abandoned, which is a continuation of Ser. No. 577,508, Sep. 4, 1990, abandoned.

[30] Foreign Application Priority Data

Sep. 7, 1989 [JP] Japan ................................ 1-230333

[51] Int. Cl.⁶ .......................................... H04N 5/225
[52] U.S. Cl. ............................ 348/340; 348/360
[58] Field of Search ................................ 348/207, 335, 348/340, 343, 375, 241, 360; 257/232, 233, 257; 359/93, 558; H04N 5/335

[56] References Cited

U.S. PATENT DOCUMENTS

| | | | |
|---|---|---|---|
| 4,178,611 | 12/1979 | Okano | 358/44 |
| 4,605,956 | 8/1986 | Cok | 358/44 |
| 4,607,168 | 8/1986 | Oritsuki et al. | 250/578 |
| 4,740,824 | 4/1988 | Yano et al. | 357/30 |
| 4,878,737 | 11/1989 | Ise | 350/167 |
| 4,896,217 | 1/1990 | Miyazawa et al. | 358/213.11 |
| 4,977,450 | 12/1990 | Yokota | 358/98 |
| 4,998,800 | 3/1991 | Nishida et al. | 350/162.2 |
| 4,998,801 | 3/1991 | Shiraishi et al. | 350/162.2 |

FOREIGN PATENT DOCUMENTS 62-289065  12/1987  Japan .

*Primary Examiner*—Wendy Greening
*Assistant Examiner*—Tuan V. Ho
*Attorney, Agent, or Firm*—Robin, Blecker, Daley & Driscoll

[57] ABSTRACT

An image pickup device includes a solid-state image pickup element having a nonuniform sensitivity within one pixel, and a high-frequency component limiting filter for limiting a high spatial frequency component of light reflected by an object to be photographed and incident on the solid-state image pickup element, wherein the high-frequency component limiting filter has a zero response at a Nyquist frequency obtained when a high-sensitivity region is given as a repetition pitch.

14 Claims, 1 Drawing Sheet

IMAGE PICKUP DEVICE

This is a continuation of prior application Ser. No. 07/942,095, filed Sep. 8, 1992, now abandoned, which is continuation application under 37 CFR 1.62 of prior application Ser. No. 07/577,508, filed Sep. 4, 1990, now abandoned.

BACKGROUND OF THE INVENTION

1. Field of the Invention

The present invention relates to an improvement in an image pickup device using a solid-state image pickup element having a nonuniform sensitivity within one pixel.

2. Related Background Art

In recent years, solid-state image pickup elements have been increasingly developed due to their many advantages as compared with camera tubes.

FIG. 1 is a schematic view of a conventional image pickup device using a solid-state image pickup element of this type, and particularly, shows a pixel structure of a solid-state image pickup element A. This structure includes a polysilicon electrode 1 connected to an electrode of a drive signal $\phi 1$, an oxide film (insulating film) 2, and a virtual electrode 3. FIG. 2 is a chart showing a potential of the solid-state image pickup element A in FIG. 1. Arrows in FIG. 2 represent the moving directions of charges.

An operation of the above structure will be described below. In a charge accumulation mode, the polysilicon electrode 1 is set at a low voltage by the drive signal $\phi 1$, thereby obtaining a potential indicated by the solid line in FIG. 2. Therefore, a charge is accumulated under the virtual electrode 3.

In a charge transfer mode, high and low voltages are alternately applied to the polysilicon electrode 1. The accumulated charges are then sequentially transferred.

This solid-state image pickup element A has a so-called virtual phase (virtual electrode) structure. A single-phase vertical transfer pulse can be used, and only a simple structure is required. Therefore, the virtual phase structure is widespread.

In the conventional image pickup device, however, since the polysilicon electrode absorbs light components having short wavelengths, the sensitivity during charge accumulation cannot be uniformed within one pixel. For this reason, a false signal component is undesirably contained in a video signal, thereby degrading quality of a reproduced image.

SUMMARY OF THE INVENTION

The present invention has been made to solve the conventional problems described above, and has as its object to provide an image pickup device capable of obtaining a high-quality reproduced image.

In order to achieve the above object of the present invention, there is provided an image pickup device comprising a solid-state image pickup element having a nonuniform sensitivity within one pixel, and high-frequency component limiting means for limiting a high spatial frequency component of light reflected by an object to be photographed and incident on the solid-state image pickup element, wherein the high-frequency component limiting means has a zero response at a Nyquist frequency obtained when a high-sensitivity region is given as a repetition pitch.

The image pickup device according to the present invention comprises the high-frequency component limiting means for reducing the false signal caused by the nonuniform sensitivity within one pixel.

The above and other objects, features, and advantages of the present invention will be apparent from the detailed description in conjunction with the accompanying drawings.

DETAILED DESCRIPTION OF THE PREFERRED EMBODIMENT

Figure 1:
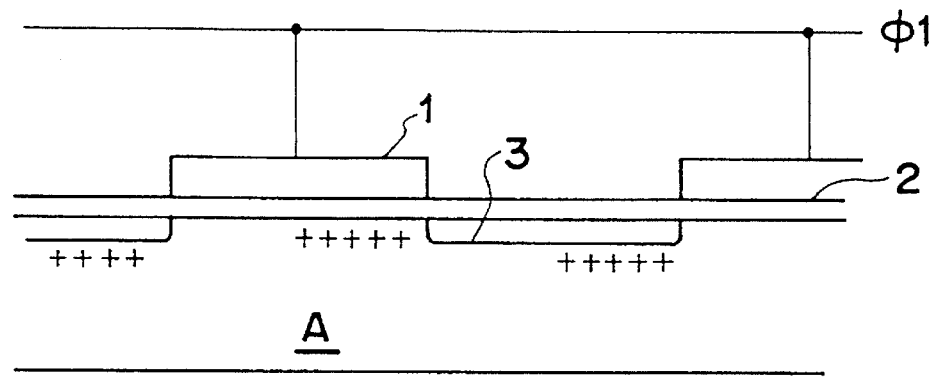
FIG. 1 is a schematic view of a conventional image pickup device.
Figure 2:
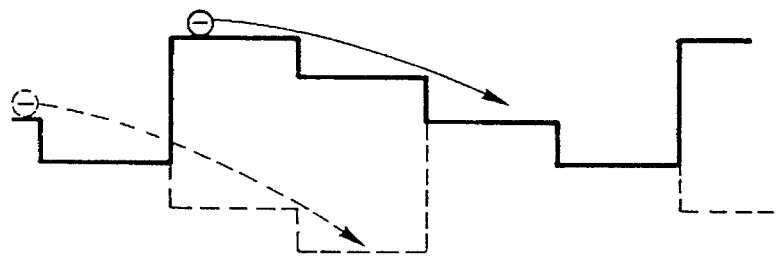
FIG. 2 is a chart for explaining a change in potential in a solid-state image pickup element shown in FIG. 1.
Figure 3:
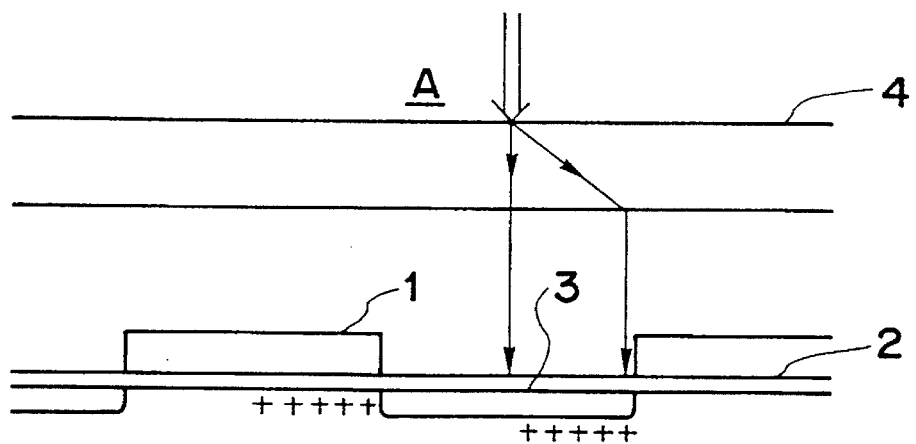
FIG. 3 is a schematic view showing an image pickup device according to an embodiment of the present invention.

FIG. 3 is a schematic view showing an image pickup device according to an embodiment of the present invention. The same reference numerals as in FIG. 1 denote the same parts in FIG. 3. Referring to FIG. 3, the image pickup device comprises a polysilicon electrode 1 connected to an electrode of a drive signal $\phi 1$, an oxide film (insulating film) 2, a virtual electrode 3, and a birefringent plate 4 serving as a high-frequency component limiting means for limiting a high spatial frequency component of light reflected by an object to be photographed and incident on a solid-state image pickup element A having a nonuniform sensitivity within one pixel.

In the image pickup device having the solid-state image pickup element A with the above pixel structure, a double image of the object is formed on a surface of the solid-state image pickup element A by the behavior of the birefringent plate 4, thereby limiting the high-frequency component of the object image. At this time, difference between an ordinary ray and an extraordinary light ray is set to be ½ that in a one-pixel portion where the polysilicon electrode 1 is not formed. That is, the response is nullified at a Nyquist frequency obtained when the region having no polysilicon electrode 1 is given as a repetition pitch, so that the false signal caused by the nonuniform sensitivity within one pixel is reduced. Therefore, a high-quality reproduced image can be obtained.

A known material for the birefringent plate 4 is quartz or calcite. The birefringent plate 4 may be adhered to a package window of the solid-state image pickup element A or may be used as a package window itself. In this manner, the layout and arrangement of the birefringent plate 4 are not limited to specific ones.

In the above embodiment, the birefringent plate 4 is used to limit the high-frequency component. However, a phase grating may be used in place of the birefringent plate. In this case, the phase grating is controlled to have a zero response at a Nyquist frequency obtained when a region having no polysilicon electrode 1 is given as a repetition pitch.

The present invention is effective in a solid-state image pickup element having a nonuniform sensitivity within one pixel. In this case, the response is nullified at a Nyquist frequency obtained when a repetition pitch is a region having a high sensitivity.

As described above, according to the present invention, by using the light high-frequency component limiting means, the false signal component of the video signal having a nonuniform sensitivity within one pixel can be reduced, and a high-quality reproduced image can be obtained.

What is claimed is:

1. An image pickup device comprising:
   a) solid-state image pickup means comprising a plurality of pixels for providing an image signal corresponding to a light incident from an object on said plurality of pixels, each pixel including a high sensitivity region and a low sensitivity region; and
   b) means for compensating for a false signal caused by a sensitivity difference between said high sensitivity region and said low sensitivity region by forming two images, said compensating means shifting said images by one half of a width of said high sensitivity region.

2. A device according to claim 1, wherein said solid-state image pickup means has a polysilicon electrode partially formed on a surface thereof.

3. A device according to claim 1, wherein said solid-state image pickup means is of a single-phase driven type.

4. A device according to claim 1, wherein said compensating means includes a birefringent plate.

5. A device according to claim 4, wherein said birefringent plate contains quartz or calcite.

6. A device according to claim 5, wherein said compensating means constitutes part of a package of said solid-state image pickup means.

7. A device according to claim 1, wherein said compensating means includes a phase grating.

8. An image pickup device comprising:
   a) image pickup means comprising a plurality of pixels for providing an image signal corresponding to a light incident from an object on said plurality of pixels, each pixel including a high sensitivity region and a low sensitivity region; and
   b) an optical low-pass filter provided in front of said image pickup means for compensating for a false signal caused by a sensitivity difference between said high sensitivity region and said low sensitivity region by forming two images, said optical low-pass filter shifting said images one half of a width of said high-sensitivity region.

9. A device according to claim 8, wherein said image pickup means has a polysilicon electrode partially formed on a surface thereof.

10. A device according to claim 8, wherein said image pickup means is of a single-phase driven type.

11. A device according to claim 8, wherein said optical low-pass filter includes a birefringent plate.

12. A device according to claim 11, wherein said birefringent plate contains quartz or calcite.

13. A device according to claim 8, wherein said optical low-pass filter constitutes part of a package of said image pickup means.

14. A device according to claim 8, wherein said optical low-pass filter includes a phase grating.

* * * * *

UNITED STATES PATENT AND TRADEMARK OFFICE
CERTIFICATE OF CORRECTION

PATENT NO. : 5,534,922
DATED : July 9, 1996
INVENTOR(S) : Nobuhiro Takeda

It is certified that error appears in the above-indentified patent and that said Letters Patent is hereby corrected as shown below:

On the cover page, Item [54], after "DEVICE" insert
-- BEING COMPENSATED FOR PIXEL NONUNIFORM SENSITIVITY --.

Col. 1, line 1, after "DEVICE" insert -- BEING COMPENSATED FOR PIXEL NONUNIFORM SENSITIVITY --.

Col. 2, line 38, after "time," insert -- a --.

Col. 2, line 39, delete "light".

Signed and Sealed this

Twenty-fourth Day of December, 1996

Attest:

BRUCE LEHMAN

*Attesting Officer*     *Commissioner of Patents and Trademarks*